(12) United States Patent
Chen

(10) Patent No.: US 6,569,713 B2
(45) Date of Patent: May 27, 2003

(54) METHOD OF FABRICATING READ ONLY MEMORY

(75) Inventor: Chih-Ping Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/881,819

(22) Filed: Jun. 15, 2001

(65) Prior Publication Data

US 2002/0192877 A1 Dec. 19, 2002

(51) Int. Cl.[7] ................................. H01L 21/82
(52) U.S. Cl. ......................... 438/128; 438/228
(58) Field of Search ........................... 438/128, 130, 438/275, 276, 278, 289, 228

(56) References Cited

U.S. PATENT DOCUMENTS 5,585,297 A * 12/1996 Sheng et al.
6,001,691 A * 12/1999 Wen

* cited by examiner

Primary Examiner—David Nelms
Assistant Examiner—Phuc T. Dang
(74) Attorney, Agent, or Firm—J.C. Patents

(57) ABSTRACT

A method of fabricating a read only memory. After forming bit lines and word lines in a substrate, a coding process is performed. A photoresist layer is formed on the substrate while performing the coding process. The photoresist layer covering a part of a first channel region under the word line is exposed, and then the photoresist layer covering a part of a second channel region under the word lines is exposed. A development step is performed to remove the photoresist layer that has been exposed. Using the remaining photoresist layer as a mask to perform an ion implantation, a coding area is formed in the first channel region and the second channel region. The photoresist layer is removed.

12 Claims, 2 Drawing Sheets

METHOD OF FABRICATING READ ONLY MEMORY

BACKGROUND OF THE INVENTION

1. Field of the Invention

The invention relates in general to a method of fabricating a memory, and more particularly, to a method of fabricating a read only memory.

2. Description of the Related Art

As the function of a computer microprocessor becomes more and more powerful, the program and calculation of a software become more and more massive, and the requirements of memories are thus more and more demanding. How to fabricate a memory with large memory capacity and low cost becomes an important topic for manufactures. Memory can be categorized into two types: read only memory (ROM) and random access memory (RAM). The read only memory only performs the "read" operation, while the random access memory has both the functions of "read" and "write".

A common read only memory uses a channel transistor as the memory cell. The specified channel region is selectively implanted with ions during the programming stage. By varying the threshold voltage, the objective of controlling the on or off of the memory cell is achieved.

The typical programming method includes implanting ions with charge opposite to that of the source/drain into the channel region to turn on/off a specific memory cell. As the ions implanted in the implantation step are opposite in charge to the source/drain region, as well as due to fabrication factors that cause such ions to be implanted into the source/drain region, the resistance of the source/drain region is increased.

SUMMARY OF THE INVENTION

The invention provides a method of fabricating a read only memory that can avoid implanting coding ions into the source/drain region. Consequently, the resistance of the source/drain region can be maintained at a certain value.

As embodied and described herein, the method of fabricating the read only memory forms a plurality of columns of bit lines in a substrate. A plurality of rows of word lines is formed, crossing over the bit lines on the substrate, wherein a first column of channel region and a second column of channel region are respectively formed in the substrate between two alternate pairs of neighboring columns of the bit lines and under each row of the word lines. Then, a photoresist layer is formed over the substrate. Next, a first exposure step is performed on the photoresist layer covering the first channel region, followed by a second exposure step performed on the photoresist layer covering the second channel region. The photoresist layer that has been exposed is removed in a development step. With the remaining photoresist layer serving as a mask, an ion implantation step is performed, so that a first coding area and a second coding area are formed on the first and second channel regions, respectively. Thereafter, the photoresist layer is removed.

During the coding step, the source/drain region between neighboring channel regions is not exposed; therefore, the problem of increasing resistance by programming is resolved.

Both the foregoing general description and the following detailed description are exemplary and explanatory only and are not restrictive of the invention, as claimed.

DESCRIPTION OF THE PREFERRED EMBODIMENTS

Figure 1:
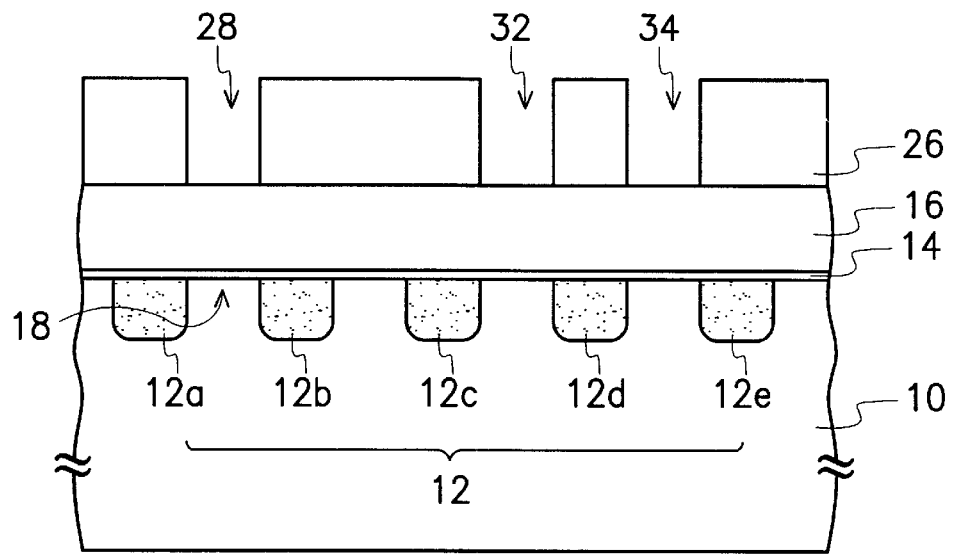
FIG. 1 shows a cross sectional view of a method for fabricating a read only memory according to the invention.
Figure 2:
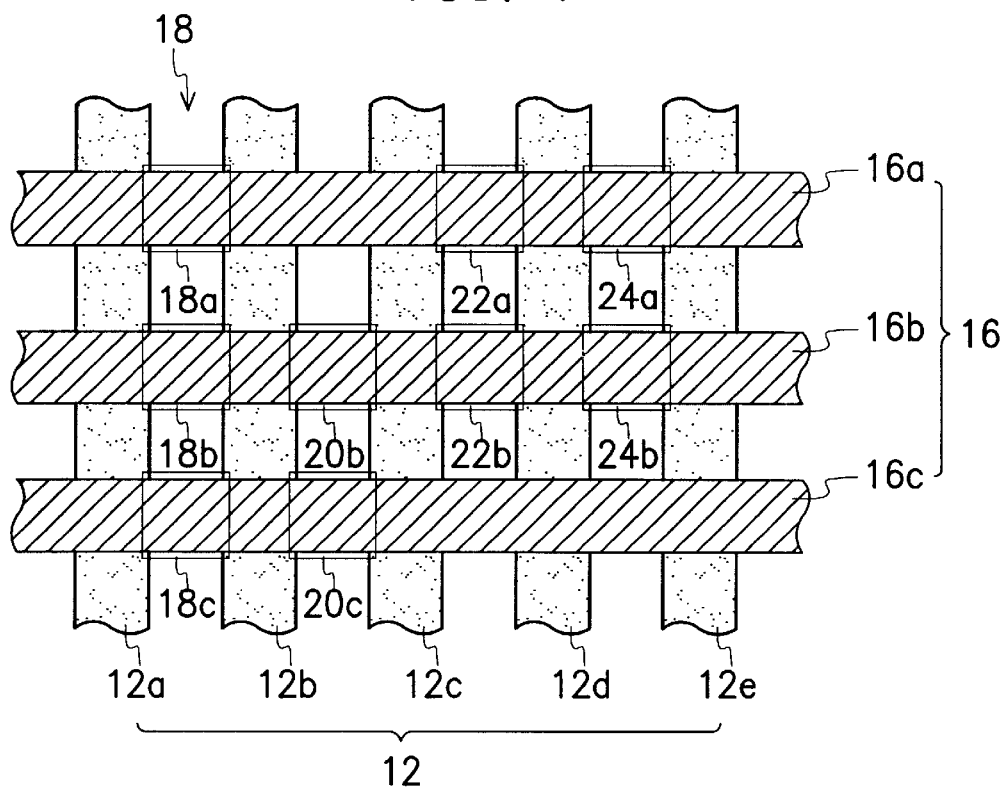
FIG. 2 to FIG. 4 are top views showing the method of fabricating a read only memory according to the invention.
Figure 3:
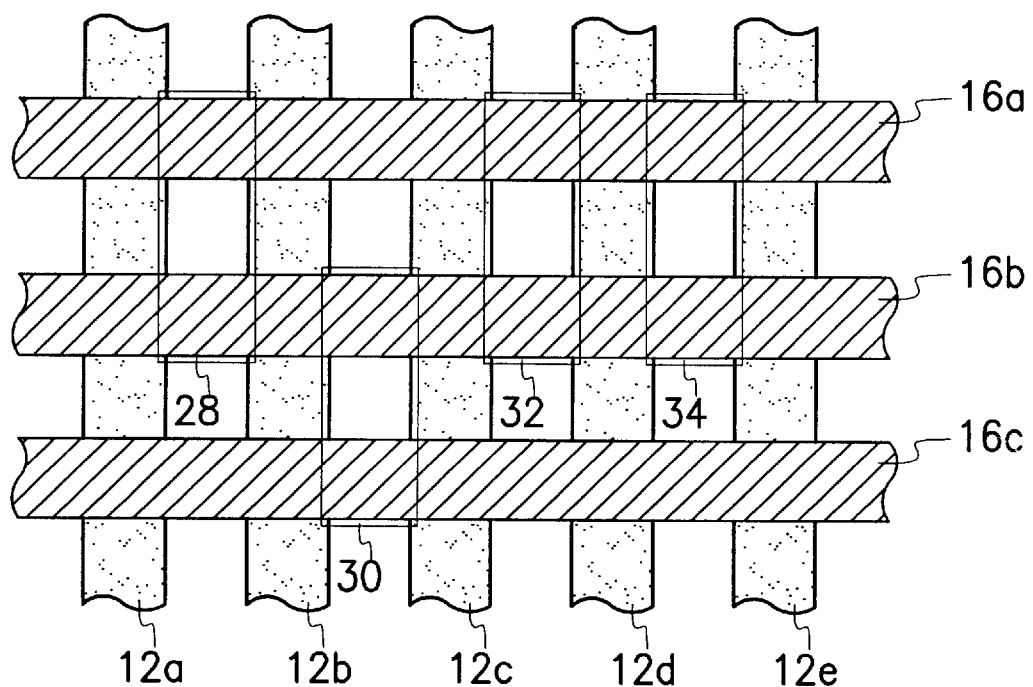
Figure 4:
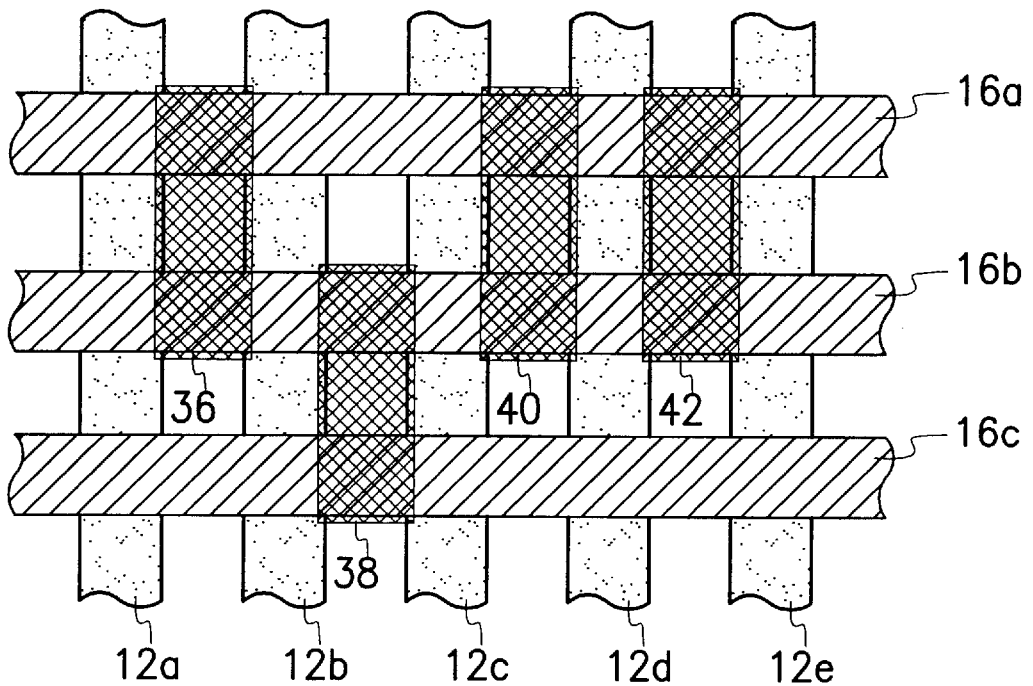

FIG. 1 shows a cross sectional view of a method for fabricating a read only memory according to the invention, while FIGS. 2 to 4 show the top views of the fabricating method.

In FIG. 1, a substrate 10 doped with the first conductive type ions, for example, a P-type substrate, is provided. Parallel bit lines 12 (from 12a to 12e) are formed in the substrate 10. The method of fabricating the bit lines 12 includes forming a patterned photoresist layer on the substrate, followed by an ion implantation step using the photoresist layer as a mask. Dopants, for example, N-type ions such as phosphoric or arsenic ions, are formed in the substrate 10 to form the bit lines 12.

A gate oxide layer 14 and a polysilicon layer 16 are formed on the substrate 10. The gate oxide layer 14 and the polysilicon layers 16 are patterned to form parallel word lines 16 (from 16a to 16c). The gate oxide layer 14 is formed by thermal oxidation, for example. The polysilicon layer 14 is formed by chemical vapor deposition (CVD), for example. Preferably, the word lines 16 perpendicularly cross over the bit lines 12 with a top view as shown in FIG. 2. In the embodiment, the direction in which each of the word lines 16 extends is referred as column, while the direction that each of the bit lines extends is referred as row.

Referring to FIGS. 1 and 2, a part of the substrate 10 between two neighboring bit lines 12 and under a part of the word lines 16 is a channel region for each memory cell. In FIG. 2, the channel regions 18a, 18b and 18c are in the same column. The word line 16b comprises channel regions 18b, 20b, 22b and 24b belong to different column.

While performing coding, the channel regions in every other column are exposed in different steps. That is, the channel regions in an odd number column are exposed first, followed by an exposure step performed on the channel regions of an even number column, such that neighboring channel regions belonging to different columns are not exposed in the same step but rather in two different steps.

For example, the channel regions 18a, 18b, 20b, 20c, 22a, 22b, 24a and 24b are predetermined channel regions to be coded. The channel regions 18a and 18b, 20b and 20c, 22a and 22b, and 24a and 24b belong to the same column, while the channel regions 18b, 20b, 22b and 24b are in the same row. To avoid a pattern rounding effect, the photoresist layer located in the channel regions 18a, 18b, 22a and 22b are exposed first, followed by exposure of the channel regions 20b, 20c, 24a and 24b. Therefore, the channel regions are exposed alternately for neighboring columns. A development process is then performed to remove the exposed photoresist layer 26. The remaining photoresist layer 26 thus has openings exposing the word lines 16. In this embodiment, the channel regions 18a and 18b are exposed at the same time to form an opening 28. That is, the photoresist layer 26 covering the channel regions 18a and 18b is exposed in the same step. Similarly, openings 30, 32 and 34 are formed to expose the channel regions 20b and 20c, 22a and 22b, and 24a and 24b as shown in FIG. 3

For channel regions belonging to the same row, two exposure steps are required for the channel regions in alternate columns. For channel regions in the same column, only one exposure step of the channel regions in every other columns is performed.

What is claimed is:

1. A method of fabricating a read only memory, comprising:

forming a plurality of columns of bit lines in a substrate;

forming a plurality of rows of word lines crossing over the bit lines on the substrate, wherein a first column of channel region and a second column of channel region are respectively formed in the substrate between two alternate pairs of neighboring columns of the bit lines and under each row of the word lines;

forming a photoresist layer on the substrate;

performing a first exposure step on the photoresist layer covering the first channel region;

performing a second exposure step on the photoresist layer covering the second channel region;

performing a development step to remove the photoresist layer that has been exposed;

using the remaining photoresist layer as a mask to perform an ion implantation step, so that a first coding area and a second coding area are formed on the first and second channel regions, respectively; and removing the photoresist layer.

2. The method according to claim 1, wherein the conductivity type of the first and second coding areas are different from that of the bit lines.

3. The method according to claim 2, wherein a conductive type of a first ion implantation step is P-type, while a conductive type of the bit lines is N-type.

4. The method according to claim 3, wherein the first ion implantation uses boron as a dopant.

5. The method according to claim 1, wherein the bit lines are formed by ion implantation.

6. The method according to claim 1, wherein the bit lines comprise a polysilicon layer.

7. A method of fabricating a read only memory, comprising:

forming a plurality of columns of bit lines in a substrate;

forming a plurality of rows of word lines crossing over the bit lines on the substrate, such that a plurality of first and second columns of channel regions are formed between alternate pairs of the columns of bit lines and under the word lines;

forming a photoresist layer on the substrate;

performing a first exposure step on the photoresist layer covering the first columns of channel regions, so that a first exposure area of the photoresist layer is formed on the first columns of channel regions;

performing a second exposure step on the photoresist layer covering the second columns of channel regions, so that a second exposure area of the photoresist layer is formed on the second columns of channel regions;

performing a development step on the photoresist layer to remove the first and the second exposure regions;

using the remaining photoresist layer as a mask to perform an ion implantation step, so that a plurality of coding areas are formed in the first and the second columns of channel regions; and removing the photoresist layer.

8. The method according to claim 7, wherein a conductivity type of the first and second coding areas are different from that of the bit lines.

9. The method according to claim 8, wherein a conductive type of the first ion implantation step is P-type, while a conductive type of the bit lines is N-type.

10. The method according to claim 9, wherein the first ion implantation uses boron as a dopant.

11. The method according to claim 7, wherein the bit lines are formed by ion implantation.

12. The method according to claim 7, wherein the bit lines comprise a polysilicon layer.

* * * * *